United States Patent [19]
Sato et al.

[11] Patent Number: 5,757,106
[45] Date of Patent: May 26, 1998

[54] PIEZOELECTRIC CERAMIC TRANSFORMER HAVING RING-SHAPED INPUT ELECTRODES PUT ON PIEZOELECTRIC CERAMIC PLATE

[75] Inventors: Yuko Sato; Takayuki Inoi, both of Tokyo, Japan

[73] Assignee: NEC Corporation, Tokyo, Japan

[21] Appl. No.: 719,959

[22] Filed: Sep. 24, 1996

[30] Foreign Application Priority Data

Sep. 29, 1995 [JP] Japan ................................. 7-253649

[51] Int. Cl.$^6$ ............................................. H01L 41/08
[52] U.S. Cl. ........................... 310/359; 310/366; 310/363
[58] Field of Search ............................ 310/359, 363, 310/366

[56] References Cited

U.S. PATENT DOCUMENTS

| | | | |
|---|---|---|---|
| 2,974,296 | 3/1961 | Rosen | 310/359 |
| 3,562,563 | 2/1971 | Schafft | 310/359 |
| 3,598,909 | 8/1971 | Sasaki et al. | 310/359 |
| 3,736,446 | 5/1973 | Berlincourt et al. | 310/359 |
| 5,229,680 | 7/1993 | Sato et al. | 310/359 |
| 5,278,471 | 1/1994 | Uehara et al. | 310/359 |
| 5,424,602 | 6/1995 | Sato et al. | 310/359 |
| 5,576,590 | 11/1996 | Ohnishi et al. | 310/359 |

FOREIGN PATENT DOCUMENTS

| | | | |
|---|---|---|---|
| 5-21858 | 1/1993 | Japan | H01L 41/107 |
| 5-110368 | 4/1993 | Japan | H03H 3/02 |
| 6-204582 | 7/1994 | Japan | 310/366 |
| 7-133976 | 5/1995 | Japan | H02M 5/04 |
| 7-193293 | 7/1995 | Japan | H01L 41/107 |
| 444341 | 9/1974 | U.S.S.R. | 310/318 |
| 575709 | 10/1977 | U.S.S.R. | 310/318 |
| 600631 | 3/1978 | U.S.S.R. | 310/318 |
| 438009 | 7/1994 | U.S.S.R. | 310/318 |

OTHER PUBLICATIONS

Masanori Ueda et al., "Energy Trapping Type Piezoelectric Transformer" Fujitsu Limited, 1992, pp. 31-35, with partial English translation.

Primary Examiner—Thomas M. Dougherty
Attorney, Agent, or Firm—Sughrue, Mion, Zinn, Macpeak & Seas, PLLC

[57] ABSTRACT

A piezoelectric ceramic transformer has a rectangular parallelopiped piezoelectric ceramic plate divided into a generator section and driving sections on both sides of the generator section, and first ring-shaped input electrodes and second ring-shaped input electrodes are alternately put on the rectangular parallelopiped piezoelectric ceramic plate at intervals so as to create electric field perfectly oriented in the longitudinal direction of the ceramic plate.

8 Claims, 10 Drawing Sheets

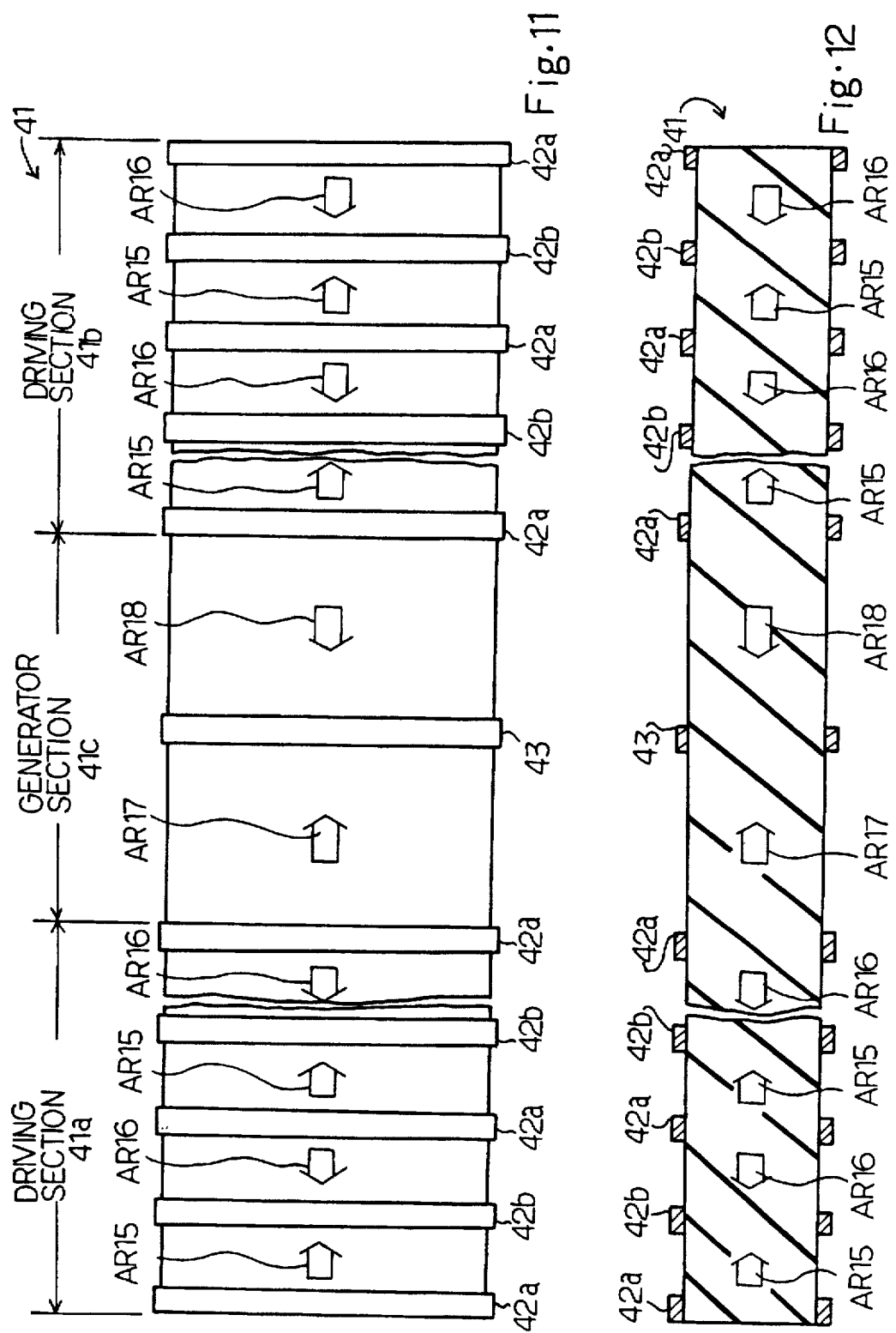

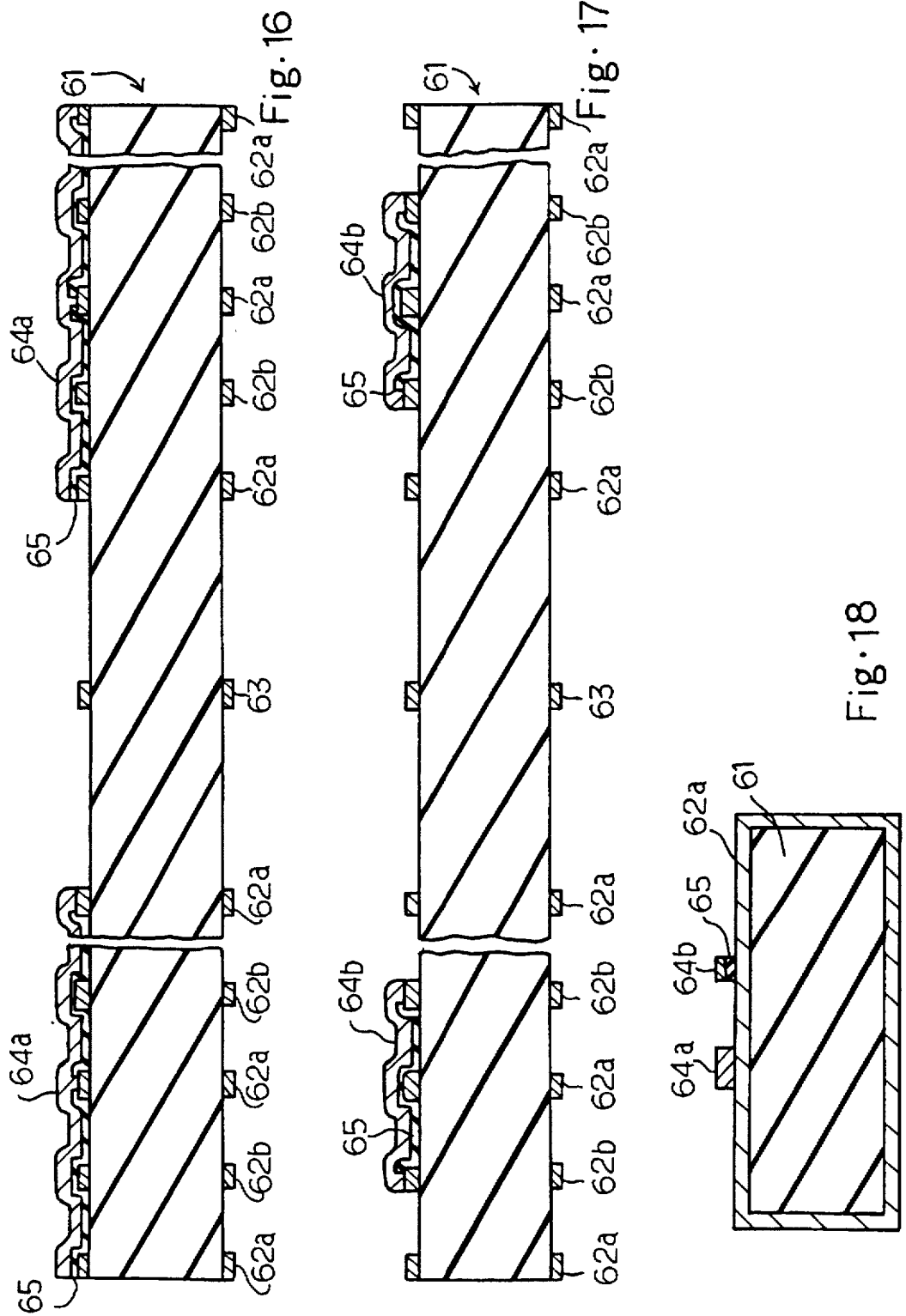

PIEZOELECTRIC CERAMIC TRANSFORMER HAVING RING-SHAPED INPUT ELECTRODES PUT ON PIEZOELECTRIC CERAMIC PLATE

FIELD OF THE INVENTION

This invention relates to a piezoelectric ceramic transformer and, more particularly, to a piezoelectric ceramic transformer having ring-shaped input electrodes put on a piezoelectric ceramic plate.

DESCRIPTION OF THE RELATED ART

A high voltage generator is incorporated in various electric appliances such as a back-light inverter or a deflector of a television receiver. A piezoelectric ceramic transformer is attractive, because it is small, thin, noncombustible and noise-free rather than a conventional electromagnetic transformer.

A kind of piezoelectric ceramic transformer is known as a Rosen-type piezoelectric ceramic transformer, and FIG. 1 illustrates a typical example of the Rosen-type field electric ceramic transformer disclosed in Japanese Patent Publication of Unexamined Application No. 7-193293. The Rosen-type piezoelectric ceramic transformer is classified into a third order Rosen type piezoelectric ceramic transformer.

The prior art third order Rosen-type piezoelectric ceramic transformer comprises a piezoelectric ceramic plate 1, two pairs of input electrodes 2a/2b and 3a/3b and a pair of output electrodes 4a/4b. The piezoelectric ceramic plate 1 is shaped into a rectangular parallelopiped configuration, and has a high-impedance generator section 1a and low-impedance driving sections 1b/1c provided on both sides of the high-impedance generator section 1a.

The low-impedance driving section 1b has an upper surface and a lower surface, and the upper/lower surfaces are covered with the input electrodes 2a/2b except for narrow peripheral areas. Similarly, the low-impedance driving section 1c has an upper surface and a lower surface, and most of each upper/lower surface is covered with the input electrode 3a/3b. Only narrow peripheral areas are uncovered with the input electrodes 3a/3b.

The low-impedance driving sections 1b/1c are polarized in the direction of the thickness of the piezoelectric ceramic plate 1 as indicated by arrows AR1 and AR2.

On the other hand, the high-impedance generator section 1a also has an upper surface and a lower surface. The output electrodes 4a and 4b are shaped into a stick configuration, and are attached to the upper and lower surfaces of the high-impedance generator section 1a. The stick-like output electrodes 4a/4b extend in the direction of the width of the piezoelectric ceramic plate 1, and are spaced from the input electrodes 2a/3a and 2b/3b, respectively. The high-impedance generator section 1a is polarized in the longitudinal direction of the piezoelectric ceramic plate 1 as indicated by arrow AR3.

When a potential is applied between the input electrodes 2a/3a and the other input electrodes 2b/3b, a kind of piezoelectric effect takes place in a perpendicular direction to the polarization of the driving sections 1b/1c, and the driving sections 1b/1c give rise to vibrations in the longitudinal direction of the piezoelectric ceramic plate 1. The kind of piezoelectric effect is called as "piezoelectric transverse 31 mode".

The vibrations are propagated to the high-impedance generator section 1a, and a mechanical strain repeatedly takes place in the direction of the polarization. Another kind of piezoelectric effect takes place in the high-impedance generator section 1a, and the high-impedance generator section 1a produces a potential difference in the direction of the polarization. The kind of piezoelectric effect is called as "piezoelectric longitudinal 33 mode". The potential difference is taken out from the output electrodes 4a and 4b. If the input signal is regulated to the frequency equal to the resonant frequency of the piezoelectric ceramic plate 1, the piezoelectric ceramic transformer generates a large output potential.

Another prior art piezoelectric ceramic transformer is disclosed in Japanese Patent Publication of Unexamined Application No. 5-21858, and FIG. 2 illustrates the prior art piezoelectric ceramic transformer disclosed in the Japanese Patent Publication.

The prior art piezoelectric ceramic transformer disclosed in the Japanese Patent Publication of Unexamined Application comprises a piezoelectric ceramic plate 11, an input electrode 12a, a ground electrode 12b paired with the input electrode 12a, a pair of polarization electrodes 13a/13b and a pair of output electrodes 14a/14b.

The piezoelectric ceramic plate 11 is shaped into a rectangular parallelopiped configuration, and is shared between a driving section 11a and a generator section 11b. The driving section 11a is polarized in the direction of the thickness of the piezoelectric ceramic plate 11 as indicated by arrow AR4; however, a portion 11ba between the input/ground electrodes 12a/12b and the polarization electrodes 13a/13b and another portion 11bb between the polarization electrodes 13a/13b and the output electrodes 14a/14b are differently polarized. Namely, the portion 11ba is polarized in the direction from the input/ground electrodes 12a/12b to the polarization electrodes 13a/13b as indicated by arrow AR5, and the portion 11bb is polarized in the opposite direction to that of the portion 11ba as indicated by arrow AR6.

The piezoelectric ceramic plate 11 has an upper surface and a lower surface, and the input electrode 12a and the ground electrode 12b occupy a third of the upper surface and a third of the lower surface measured from the left end surface 11c of the piezoelectric ceramic plate 11.

The polarization electrodes 13a and 13b are shaped like sticks, and extend in the direction of the width of the piezoelectric ceramic plate 11. The polarization electrodes 13a and 13b are located at two third of the length of the piezoelectric ceramic plate measured from the left end surface 11c, and are attached to the upper surface and the lower surface, respectively.

The output electrodes 14a and 14b are also shaped like sticks, and extend in the direction of the width of the piezoelectric ceramic plate 11. The polarization electrodes 13a and 13b are located at five sixth of the length of the piezoelectric ceramic plate measured from the left end surface 11c, and are attached to the upper surface and the lower surface, respectively.

The prior art piezoelectric ceramic transformer shown in FIG. 2 further comprises an input lead wire 15a connected to the input electrode 12a, a ground lead wire 15b connected to the ground electrode 12b, a lead wire 15c connected to the polarization electrode 13a, an interconnecting lead wire 15d connected between the polarization electrodes 13a and 13b, an output lead wire 15e connected to the output electrode 14a and an interconnecting lead wire 15f connected between the output electrodes 14a and 14b.

The input lead wire 15a, the ground lead wire 15b, the output lead wire 15e and the interconnecting lead wire 15f are connected to the input electrode 12a, the ground electrode 12b and the output electrodes 14a/14b at nodal points where nodes N1/N2 of vibrations VB take place (see FIG. 3).

When a potential is applied through the input/ground lead wires 15a/15b between the input electrode 12a and the ground electrode 12b, the vibrations VB takes place in the longitudinal direction of the piezoelectric ceramic plate 11 due to the piezoelectric transverse 31 mode, and the piezoelectric longitudinal 31 mode causes the generator section 11b to produce a potential at the output electrodes 14a/14b. The output potential is taken out through the output lead wire 15e.

Yet another prior art piezoelectric ceramic transformer is disclosed in Japanese Patent Publication of Unexamined Application No. 5-110368, and FIG. 4 illustrates the prior art piezoelectric ceramic transformer disclosed in the Japanese Patent Publication.

The prior art piezoelectric ceramic transformer disclosed in the Japanese Patent Publication of Unexamined Application comprises a piezoelectric ceramic plate 21, an input electrode 22a, a ground electrode 22b paired with the input electrode 22a, a pair of polarization electrodes 23a/23b, a pair of output electrodes 24a/24b and a feedback electrode 25.

The piezoelectric ceramic plate 21 is shaped into a rectangular parallelopiped configuration, and is divided into a driving section 21a and a generator section 21b. The driving section 21a is polarized in the direction of the thickness of the piezoelectric ceramic plate 21 as indicated by arrow AR7; however, a portion 21ba between the input/ground electrodes 22a/22b and the polarization electrodes 23a/23b and another portion 21bb between the polarization electrodes 23a/23b and the output electrodes 24a/24b are differently polarized. Namely, the portion 21ba is polarized in the direction from the input/ground electrodes 22a/22b to the polarization electrodes 23a/23b as indicated by arrow AR8, and the portion 21bb is polarized in the opposite direction to that of the portion 21ba as indicated by arrow AR9.

The piezoelectric ceramic plate 21 has an upper surface and a lower surface. The input electrode 22a and the feedback electrode 25 occupy most of a third of the upper surface measured from a left end surface 21c, and the feedback electrode 25 is separated from the input electrode 22a. The ground electrode 22b occupies a third of the lower surface measured from the left end surface 21c.

The polarization electrodes 23a and 23b are shaped like sticks, and extend in the direction of the width of the piezoelectric ceramic plate 21. The polarization electrodes 23a and 23b are located at two third of the length of the piezoelectric ceramic plate 21 measured from the left end surface 21c, and are attached to the upper surface and the lower surface, respectively.

The output electrodes 24a and 24b are also shaped like sticks, and extend in the direction of the width of the piezoelectric ceramic plate 21. The polarization electrodes 23a and 23b are located at five sixth of the length of the piezoelectric ceramic plate 21 measured from the left end surface 21c, and are attached to the upper surface and the lower surface, respectively.

The prior art piezoelectric ceramic transformer shown in FIG. 4 further comprises an input lead wire 26a connected to the input electrode, a ground lead wire 26b connected to the ground electrode 22b, a feedback lead wire 26c connected to the feedback electrode 25, a lead wire 26d connected to the polarization electrode 23a, an interconnecting lead wire 26e connected between the polarization electrodes 23a and 23b, an output lead wire 26f connected to the output electrode 24a and an interconnecting lead wire 26g connected between the output electrodes 24a and 24b.

The input/ground/feedback electrodes 26a/26b/26c, the output lead wire 26f and the interconnecting lead wire 26g are connected to the input/ground/feedback electrodes 22a/22b/25 and the output electrodes 24a/24b at nodal points where nodes N11/N12 of vibrations VB take place (see FIG. 5).

When a potential is applied through the input/ground lead wires 26a/26b between the input electrode 22a and the ground electrode 22b, the vibrations VB takes place in the longitudinal direction of the piezoelectric ceramic plate 21 due to the piezoelectric transverse 31 mode, and the piezoelectric longitudinal 31 mode causes the generator section 21b to produce a potential at the output electrodes 24a/24b. The output potential is taken out through the output lead wire 26f.

The first to third prior art piezoelectric ceramic transformers achieved a fairly good step-up ratio or the ratio between the input voltage and the output voltage. However, user had requested the manufacturer of the piezoelectric ceramic transformer to achieve the step-up ratio larger than those of the first to third piezoelectric ceramic transformers. If the piezoelectric ceramic plate is decreased in thickness, the step-up ratio is increased. However, the thinner the thickness is, the larger the loss of electric power is. For this reason, the improvement in step-up ratio seems to reach the limit.

The present inventors proposed a piezoelectric ceramic transformer in the specification for Japanese Patent Application No. 7-133976 filed on May 31, 1995, and a U.S. patent application was filed between May 29 to May 31, 1996 claiming the priority on the basis of the Japanese Patent Application. Japanese Patent Application 7-133976 has not been published in Japan, yet. The applicants have not received a temporary serial number card, yet.

FIG. 6 illustrates the piezoelectric ceramic transformer disclosed in Japanese Patent Application No. 7-133976. The piezoelectric ceramic transformer comprises a piezoelectric ceramic plate 31, two pairs of comb-like input electrodes 32a/32b, a pair of output electrodes 33a/33b and an end surface electrode 34 for an alternating polarization.

The piezoelectric ceramic plate 31 is divided into a driving section 31a and a generator section 31b. The driving section 31a has narrow portions exposed to the gaps between the finger portions of the comb-like electrodes 32a and 32b, and the narrow portions are alternately polarized as indicated by arrows AR10 and AR11. On the other hand, the generator section 31b is polarized in the longitudinal direction of the ceramic plate 31 as indicated by arrow AR12.

When a potential is applied between the input electrodes 32a and the input electrodes 32b, the driving section 31a vibrates in the piezoelectric longitudinal 33 mode, and the vibrations are propagated to the generator section 31b. The vibrations cause the generator section 31b to generate a potential due to the piezoelectric longitudinal 33 mode, and the potential is taken out from the output electrodes 33a/33b.

The piezoelectric ceramic transformer previously proposed drastically improves the step-up ratio, because it is possible to decrease the gap between the fingers 32aa and 32ba. However, the piezoelectric ceramic transformer encounters a problem in that cracks take place in the portions exposed to the gaps between finger portions 32aa/32ba and boss portions 32bb/32ab. Moreover, the previously proposed piezoelectric ceramic transformer does not achieve a step-up ratio so large as expected.

SUMMARY OF THE INVENTION

It is therefore an important object of the present invention to provide a piezoelectric ceramic transformer which improves the step-up ratio without the cracks.

The present inventors contemplated the problem inherent in the previously proposed piezoelectric ceramic transformer, and electromagnetically analyzed the piezoelectric ceramic transformer as follows. As shown in FIG. 7, the comb-like input electrodes 32a and 32b were interdigitated with each other, and the finger portions 32aa of the comb-like input electrode 32a were inserted between the finger portions 32ba of the other comb-like input electrode 32b. Although the electric field was expressed by arrows AR13 parallel to one another between the finger portions 32aa and 32ba, the lines of electric force were concentrated to the leading end of the finger portions 32aa/32ba in the electric field between the boss portions 32bb of the comb-like electrodes 32a/32b and the finger portions 32ba/32aa as encircled by broken lines BL1. Therefore, the electric field between the boss portion 32bb and the finger portions 32ba/32ab was not directed in the longitudinal direction of the piezoelectric ceramic plate 31. The present inventors concluded that the turbulence of the electric field caused the cracks to took place between the boss portions 32ab/32bb and the finger portions 32ba/32aa. The unexpected step-up ratio was also derived from the electric field which was not directed to the longitudinal direction of the piezoelectric ceramic plate 31.

To accomplish the object, the present invention proposes to shape input electrodes into a ring configuration.

In accordance with one aspect of the present invention, there is provided a piezoelectric ceramic transformer comprising: an elongated ceramic plate divided into at least one driving section and a generator section in a longitudinal direction of the elongated ceramic plate, the generator section being polarized in the longitudinal direction; a first driving electrode shaped into a ring configuration so as to be held in contact with an upper major surface, a lower major surface and side surfaces of the at least one driving section and electrically connected to a source of high voltage; a second driving electrode shaped into a ring configuration so as to be held in contact with the upper major surface, the lower major surface and the side surfaces of the at least one driving section, and electrically connected to a source of low voltage, a portion of the at least one driving section between the first driving electrode and the second driving electrode being polarized in the longitudinal direction; and an output electrode attached to the generator section.

In accordance with another aspect of the present invention, there is provided a piezoelectric ceramic transformer comprising: a piezoelectric ceramic plate having a longitudinal direction, a transverse direction perpendicular to the longitudinal direction, a direction of thickness normal to a plane defined by the longitudinal direction and the transverse direction, a first major surface substantially in parallel to the plane, a second major surface substantially in parallel to the first major surface and side surfaces substantially in parallel to a plane defined by the longitudinal direction and the direction of thickness, and divided into at least one driving section and at least one generator section in the longitudinal direction; a plurality of first input electrodes shaped into a ring configuration, held in contact with the first major surface, the second major surface and the side surfaces of the at least one driving section, and spaced from one another in the longitudinal direction; a plurality of second input electrodes shaped into a ring configuration, held in contact with the first major surface, the second major surface and the side surfaces of the at least one driving section, and alternated with the plurality of first input electrodes so as to form gaps therebetween, the plurality of first input electrodes and the plurality of second input electrodes defining a plurality of portions in the at least one driving section, every two adjacent portions in the at least one driving section being oppositely polarized in the longitudinal direction; an output electrode held in contact with the first major surface and the second major surface in the at least one generator section; a first input wiring connected to the plurality of first electrodes; and a second input wiring connected to the plurality of second electrodes.

BRIEF DESCRIPTION OF THE DRAWINGS

The features and advantages of the piezoelectric ceramic transformer according to the present invention will be more clearly understood from the following description taken in conjunction with the accompanying drawings in which:

FIG. 11 is a plan view showing the directions of polarization in the piezoelectric ceramic transformer;

FIG. 12 is a cross sectional view showing the directions of polarization in the piezoelectric ceramic transformer;

FIG. 16 is a cross sectional view taken along line C—C of FIG. 15 and showing the structure of the piezoelectric ceramic transformer;

FIG. 17 is a cross sectional view taken along line D—D of FIG. 15 and showing the structure of the piezoelectric ceramic transformer; and FIG. 18 is a cross sectional view taken along line E—E of FIG. 15 and showing the structure of the piezoelectric ceramic transformer.

DESCRIPTION OF THE PREFERRED EMBODIMENTS

First Embodiment

Figure 8:
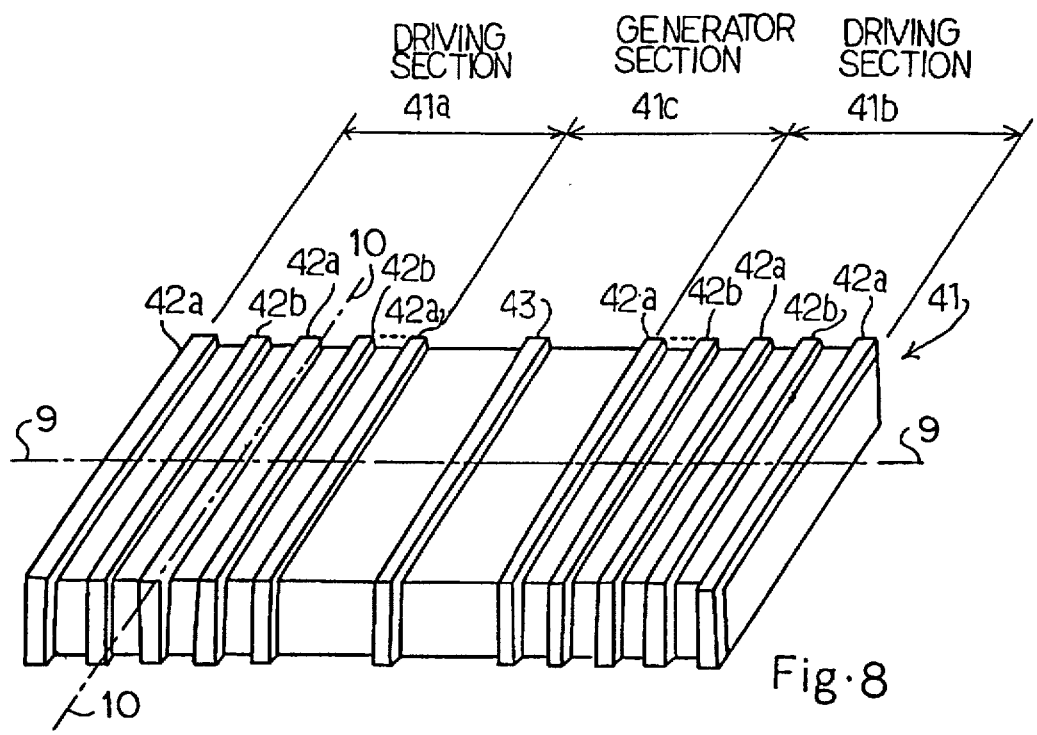
FIG. 8 is a perspective view showing a piezoelectric ceramic transformer according to the present invention.
Figure 9:
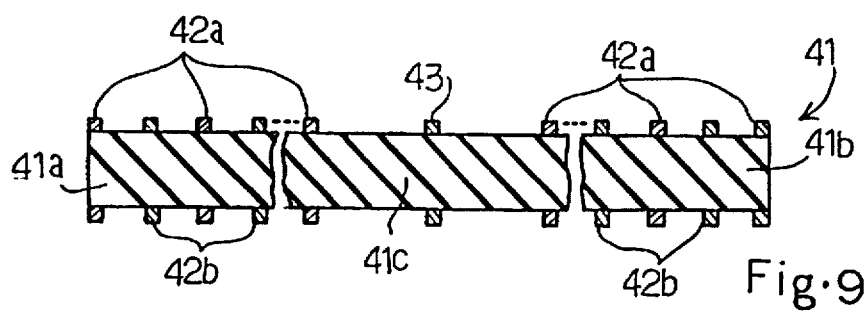
FIG. 9 is a cross sectional view taken along line A—A of FIG. 8 and showing the piezoelectric ceramic transformer.
Figure 10:
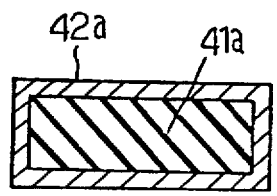
FIG. 10 is a cross sectional view taken along line B—B of FIG. 8 and showing the piezoelectric ceramic transformer.

Referring to FIGS. 8 to 10 of the drawings, a piezoelectric ceramic transformer embodying the present invention largely comprises a piezoelectric ceramic plate 41, a plurality of input electrodes 42a/42b and an output electrode 43. The piezoelectric ceramic transformer is classified into the third order Rosen-type piezoelectric ceramic transformer.

The piezoelectric ceramic plate 41 has a rectangular parallelopiped configuration, and both end portions and a central portion are assigned to driving sections 41a/41b and a generator section 41c, respectively. The input electrodes 42a and 42b are shaped into a ring configuration, and are fixed to the driving sections 41a/41b at intervals. The input electrodes 42a are alternated with the input electrodes 42b. The output electrode 43 is also shaped into the ring configuration, and is fixed to the generator section 41c. Though not shown in FIGS. 8 to 10, the input electrodes 42a are electrically connected to an input terminal, and another input terminal is connected to the other input nodes 42b.

A pair of conductive strips formed on the upper and lower surfaces of the ceramic plate 41 and lead wire connected between the conductive strips may form the output electrode 43.

In this instance, the piezoelectric ceramic plate 41 is 42.0 millimeters in length, 10.0 millimeters in width and 1.0 millimeter in thickness. The input electrodes 42a/42b are 0.3 millimeter in width, and are spaced from the adjacent input electrode or electrodes by 0.6 millimeter. The total number of the input electrodes 42a/42b is sixteen. However, the dimensions, the intervals and the number of input electrodes 42a/42b are optimized in dependent on the piezoelectric ceramic plate 41, and, accordingly, are variable.

The driving sections 41a/41b and the generator section 41c are polarized as indicated by arrows AR15/AR16 and AR17/AR18 (see FIGS. 11 and 12). The driving sections 41a/41b are divided into narrow portions exposed to gaps between the input electrodes 42a and 42b, and the narrow portions are oppositely polarized in the longitudinal direction of the piezoelectric ceramic plate 41. The output electrode 43 divides the generator section 41c into two halves exposed between the input electrodes 42a and the output electrode 43, and the two halves are also oppositely polarized in the longitudinal direction of the piezoelectric ceramic plate 41.

Such an opposite polarization is achieved as follows. As to the opposite polarization of the driving sections 41a and 41b, the piezoelectric ceramic transformer is heated to a certain temperature, and the input electrodes 42b are positively biased with respect to the other input electrodes 42a. Then, the narrow portions are oppositely polarized in the longitudinal direction of the piezoelectric ceramic plate 41. There is no problem to positively bias the input electrodes 42a with respect to the other input electrodes 4b. Namely, the bias is inverted between the input electrodes 42a and the other input electrodes 42b. While the generator section 41c is being polarized, the input electrodes 42a and 42b are short circuited with one another, and the output electrode 43 is positively biased with respect to the input electrodes 42a/42b in certain high temperature ambience. Of course, the output electrode 43 may be negatively biased with respect to the input electrodes 42a/42b.

EXAMPLE

The present inventors fabricated a piezoelectric ceramic transformer implementing the first embodiment as follows.

First, the present inventors prepared piezoelectric ceramic powder in $PbZrO_3$—$PbTiO_3$ system. The piezoelectric ceramic powder was manufactured by Tokin Corporation, and had a product name of NEPEC8. Paste was formed from the piezoelectric ceramic powder, and was shaped into a rectangular parallelopiped configuration. The paste was sintered, and the sintered product measured 42.0 millimeters in length, 10.0 millimeters in width and 1.0 millimeter in thickness.

Conductive paste such as silver paste or silver-palladium paste was screen printed on the sintered product or the piezoelectric ceramic plate 41 for the input electrodes 42a/42b and the output electrode 43. The conductive paste was sintered so as to form the input electrodes 42a/42b and the output electrode 43.

Subsequently, the generator section 41c was polarized by using an electric field quenching technique. In detail, the input electrodes 32a and 42b were short-circuited with conductive jigs (not shown), and the output electrode 43 was grasped with another conductive jig (not shown). The piezoelectric ceramic plate 41 was put into high temperature air at 300 degrees to 350 degrees in centigrade, and direct current was applied between the input electrodes 42a/42b and the output electrode 43 in such a manner as to create electric field ranging between 0.5 kv/mm to 0.7 kv/mm. The temperature was lowered to 100 degrees in centigrade or less without removal of the electric field. When the piezoelectric ceramic plate 41 was lowered to or under 100 degrees in centigrade, the direct current was removed. As a result, the generator section 41c was polarized as shown in FIGS. 11 and 12.

Subsequently, the driving sections 41a/41b were polarized by using a high-temperature polarizing technique. In detail, conductive probes (not shown) were pressed against the input electrodes 42a and the input electrodes 42b, and the piezoelectric ceramic plate 41 was dipped into high-temperature silicon oil. The silicon oil was heated to 180 degrees in centigrade, and direct current was applied between the input electrodes 42a and 42b in such a manner as to create electric field of 1.8 kv/mm. The driving sections 41a/41b were polarized as shown in FIGS. 11 and 12.

Figure 13:
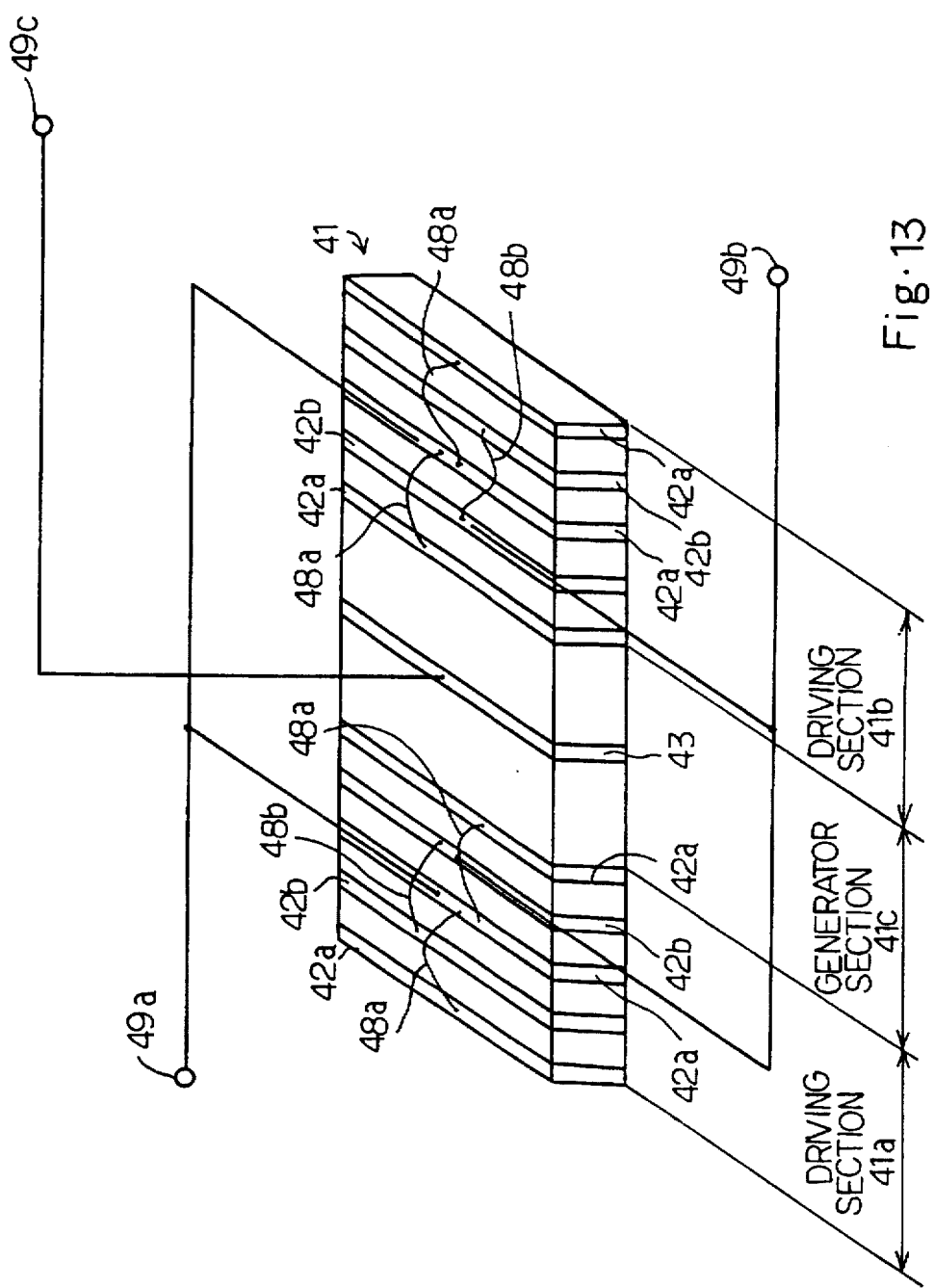
FIG. 13 is a schematic perspective view showing electrical connections to the piezoelectric ceramic transformer.

Finally, conductive wires 48a and 48b were connected between the input electrodes 42a and between the other input electrodes 42b by using a wire bonding technique as shown in FIG. 13. Aluminum wires was desirable for the conductive wires 48a and 48b, because the wire bonding was carried out at room temperature. The wire-bonding at room temperature prevented the piezoelectric ceramic transformer from destruction of the polarization.

The piezoelectric ceramic transformer thus fabricated was connected to input terminals 49a/49b and an output terminal 49c. It is desirable to connect the input terminals 49a and 49b to the input electrode 42a positioned at an intermediate point between the input electrodes 42a at both ends of the driving section 41a and to the input electrode 42b positioned at an intermediate point between the input electrodes 42b at both ends of the other driving section 41b. The output terminal 49c was connected to an intermediate point of the output electrode 43 attached to an intermediate area of the generator section 41c.

The piezoelectric ceramic transformer behaved as follows. Alternating current was applied between the input terminals 49a and 49b, and the frequency of the alternating current was regulated to the resonant frequency of the piezoelectric ceramic transformer.

Every narrow portion between the adjacent input electrodes 42a and 42b converted the electric energy through the electromechanical coupling factor k33 to strain in the longitudinal direction of the piezoelectric ceramic plate 41 in the piezoelectric longitudinal effect 33 mode. The narrow portions were oppositely polarized, and, for this reason, repeated the elongation and the contraction in phase with one another. As a result, the piezoelectric ceramic plate 41 vibrated in the longitudinal direction. The vibrations were propagated to the generator section 41c, and the generator section 41c converted the strain through the electromechanical coupling factor k33 to voltage in the piezoelectric longitudinal effect 33 mode.

The piezoelectric ceramic transformer according to the present invention converts the electric energy to the strain through the electromechanical coupling factor k33 and the strain to the electric energy also through the electromechanical coupling factor k33. In general, the electromechnical coupling factor k33 for the longitudinal direction is larger in value than the electromechnical coupling factor k31 for the direction of thickness. The reason for the difference is properties of piezoelectric material. The piezoelectric ceramic plate 41 was formed from the piezoelectric ceramic powder in the PZT ($PbZrO_3$—$PbTiO_3$) system manufactured by Tokin Corporation and sold as NEPEC8. The electromechnical coupling factors k31 and k33 of the piezoelectric ceramic material are 0.34 and 0.67, respectively. The electromechanical coupling factor k33 is twice as large as the electromechanicl coupling factor k31. When piezoelectric ceramic material is formed into a piezoelectric ceramic plate, the electromechanical coupling factors k31 and k33 are affected by the shape effect, and are diferent from those of the piezoelectric ceramic material. However, the relation between the electromechanical coupling factors k31 and k33 is unchanged, and the electromechanical coupling factor K33 is still larger in value than the electromechanical coupling factor k31.

The electromechanical coupling factor is representative of a degree of coupling between an electric system and a mechanical system, and the step-up ratio is proportional to the electromechanical coupling factor. On other words, the larger the electromechnical coupling factor is, the larger the step-up ratio is.

The first to third prior art piezoelectric ceramic transformers have respective driving sections 2a/3a, 11a and 21a polarized in the direction of thickness, and the step-up ratio are relatively small due to the electromechanical coupling factor k31. The piezoelectric ceramic transformer according to the present invention is firstly discriminative from the first to third prior art piezoleectric ceramic transformers in that both driving and generator sections 41a/41b and 41c are polarized in the longitudinal direction of the ceramic plate 41, and the electric energy and the mechanical energy are converted through the electromechanical coupling factor k33 larger than the electromechanical coupling factor k31.

As described hereinbefore, the electromechanical coupling factor k33 is twice as large as the electromechanical coupling factor k31, and the piezoelectric ceramic transformer according to the present invnetion is expected to achive a step-up ratio twice as large as those of the first to third prior art piezoelectric ceramic transformers.

Figure 1:
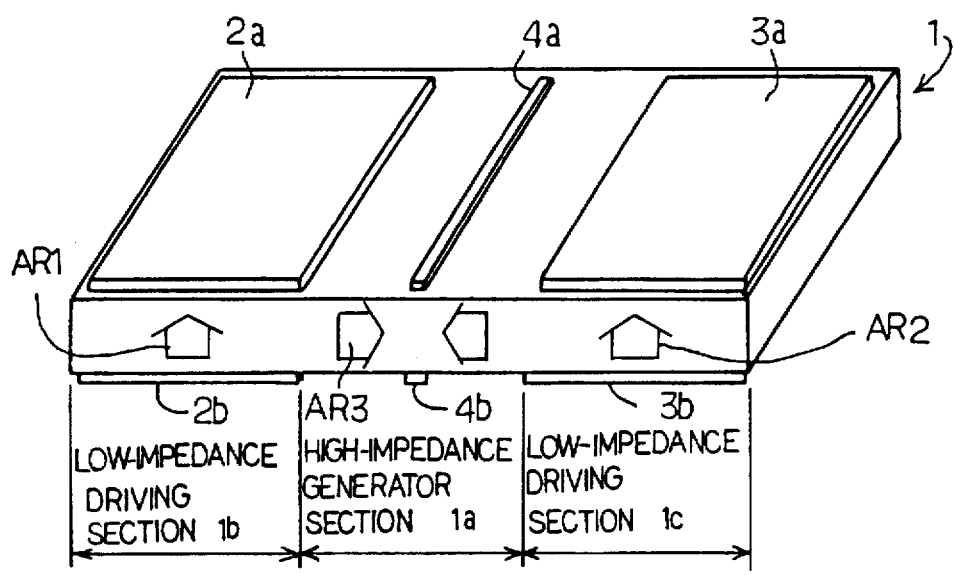
FIG. 1 is a perspective view showing the first prior art piezoelectric ceramic transformer disclosed in Japanese Patent Publication of Unexamined Application No. 7-193293.
Figure 2:
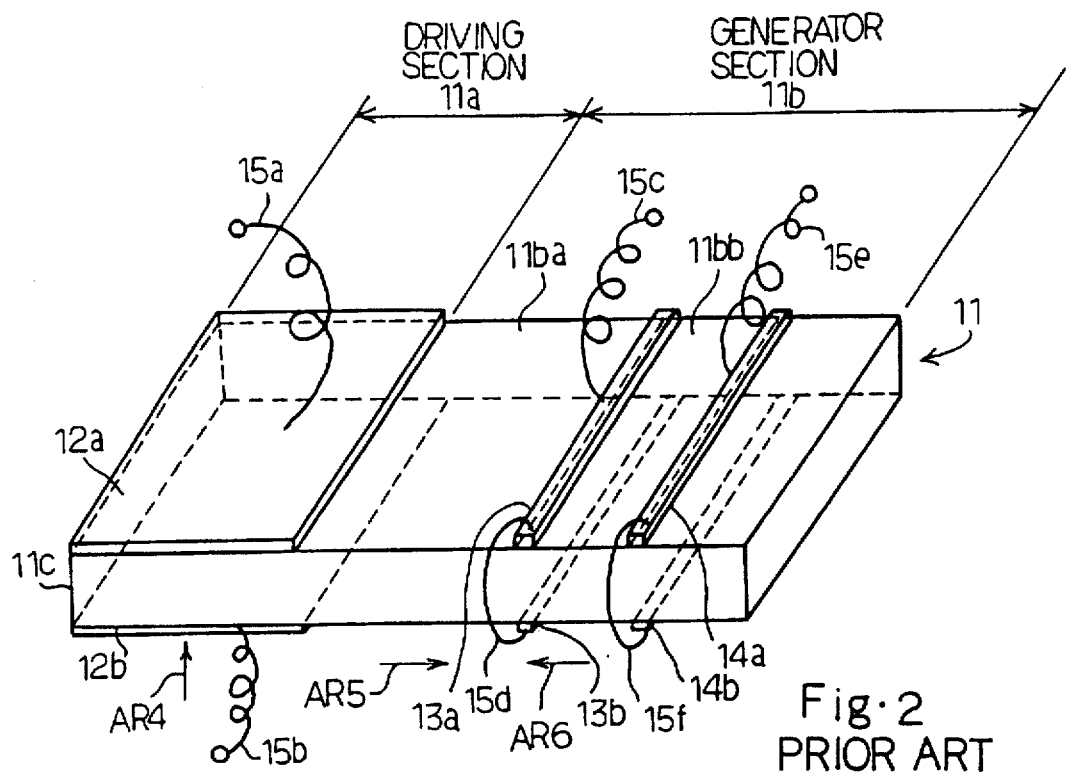
FIG. 2 is a perspective view showing the second prior art piezoelectric ceramic transformer disclosed in Japanese Patent Publication of Unexamined Application No. 5-21858.
Figure 3:
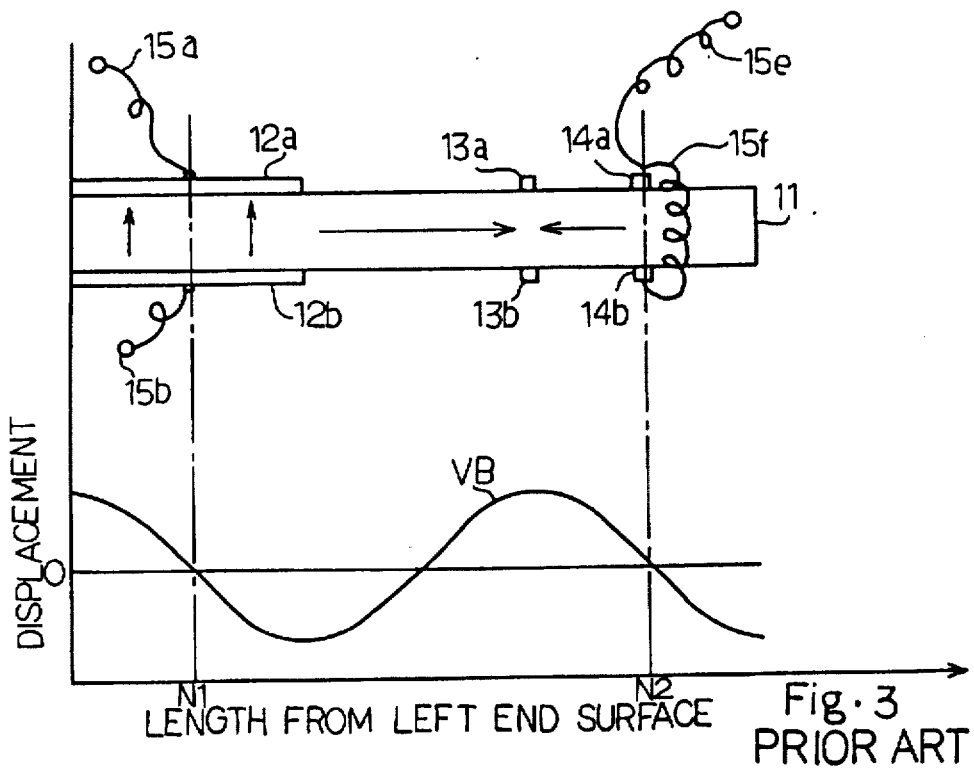
FIG. 3 is a view showing the relation between the positions of the electrodes and the amplitude of the vibrations generated in the second prior art piezoelectric ceramic transformer.
Figure 4:
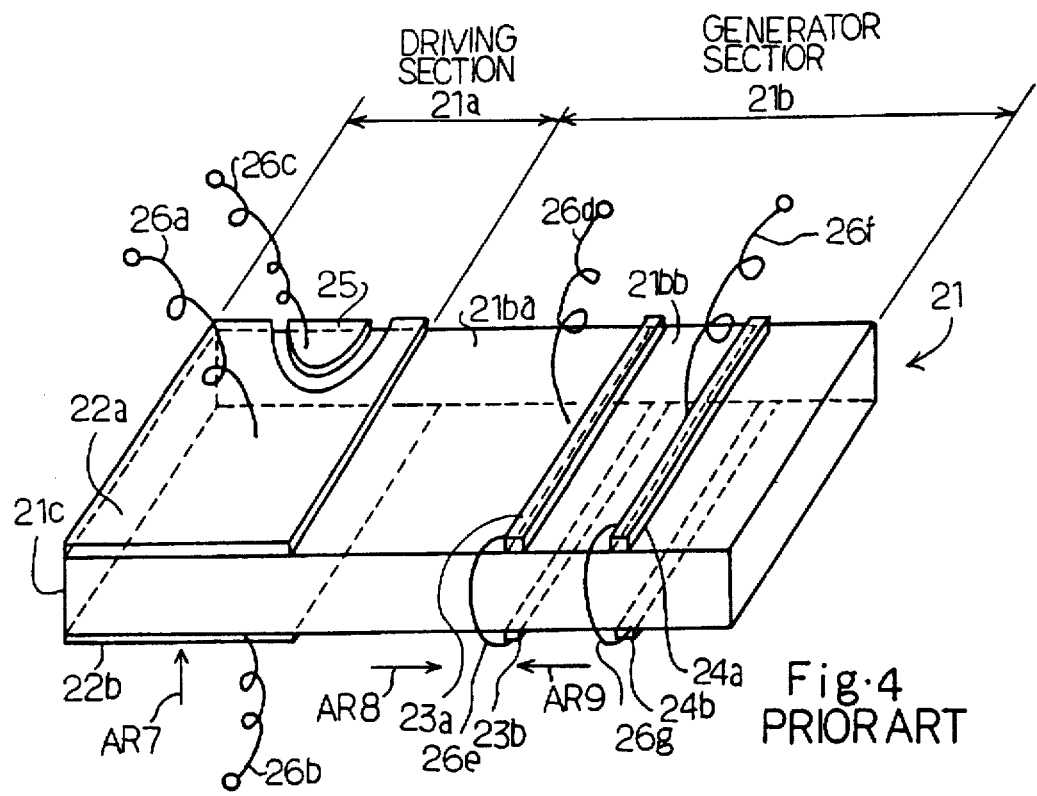
FIG. 4 is a perspective view showing the third prior art piezoelectric ceramic transformer disclosed in Japanese Patent Publication of Unexamined Application No. 5-110368.
Figure 5:
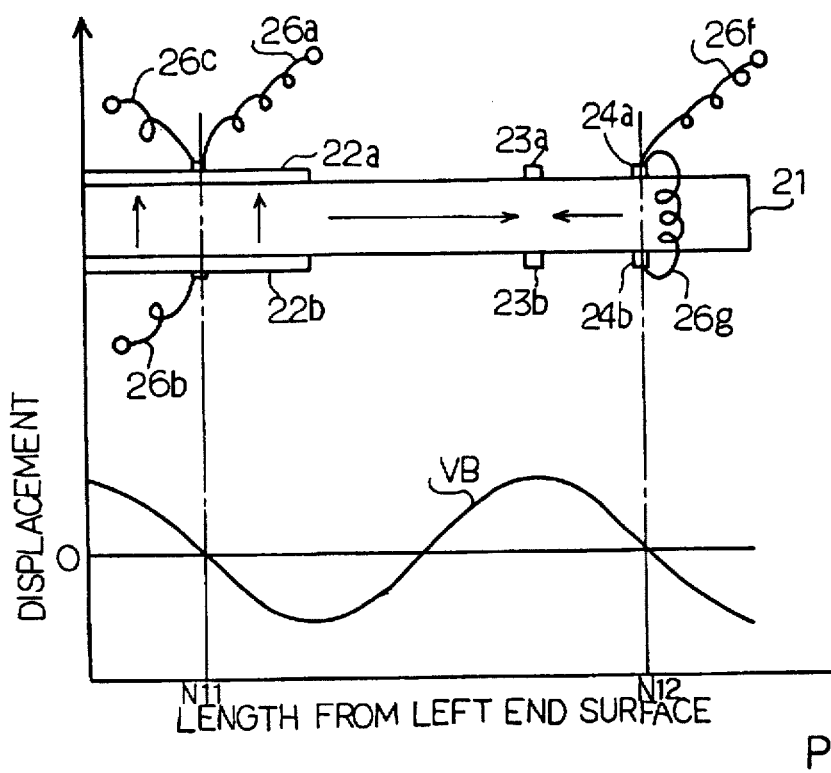
FIG. 5 is a view showing the relation between the positions of the electrodes and the amplitude of the vibrations generated in the third prior art piezoelectric ceramic transformer.

In fact, the present inventors measured the electromechanical coupling factors k31 and k33 for the piezoelectric ceramic transformer according to the present invention and the first prior art piezoelectric ceramic transformer shown in FIG. 1. The electromechanical coupling factors k31 and k33 of the driving sections 1b/1c and the generator section 1a were 0.17 and 0.36. On the other hand, the piezoelectric ceramic transformer according to the present invnetion achieved the electromechanical coupling factor k31 in the driving sections 41a/41b at 0.27 and in the generator section 41c at 0.35. The electromechanical coupling factor in the driving sections 41a/41b was 1.6 times as large as the electromechanical coupling factor in the driving sections 1b/1c, and, accordingly, the step-up ratio was increased from 26 to 42. Thus, the piezoelectric ceramic transformer according to the presnt invention was 1.6 times larger in step-up ratio than the first prior art piezoelectric ceramic transformer.

Figure 6:
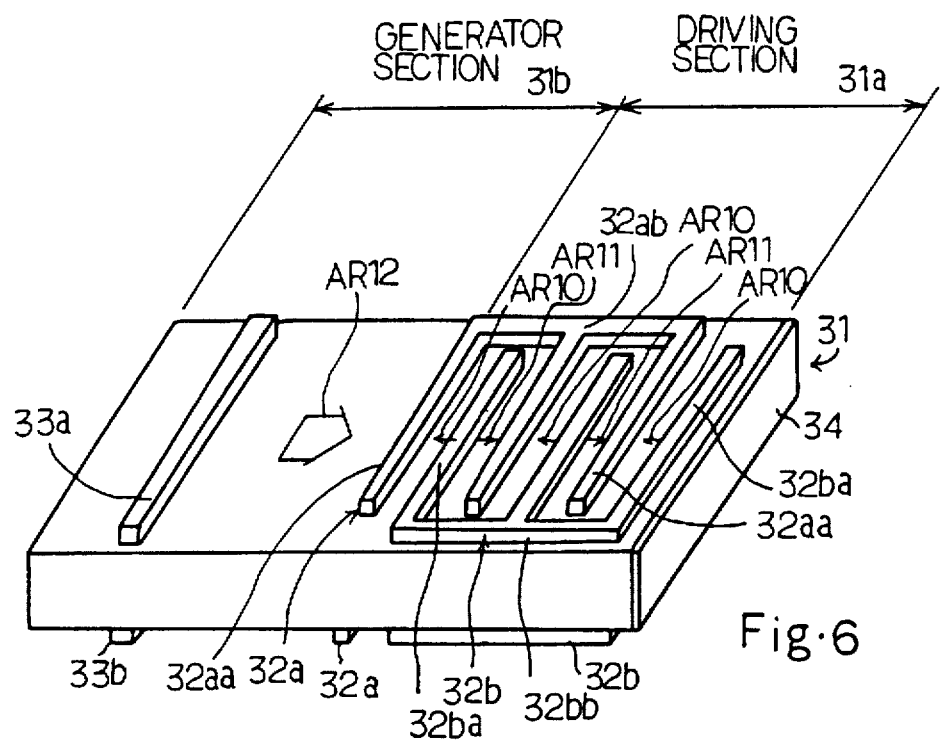
FIG. 6 is a perspective view showing the piezoelectric ceramic transformer disclosed in Japanese Patent Application No. 7-133976.
Figure 7:
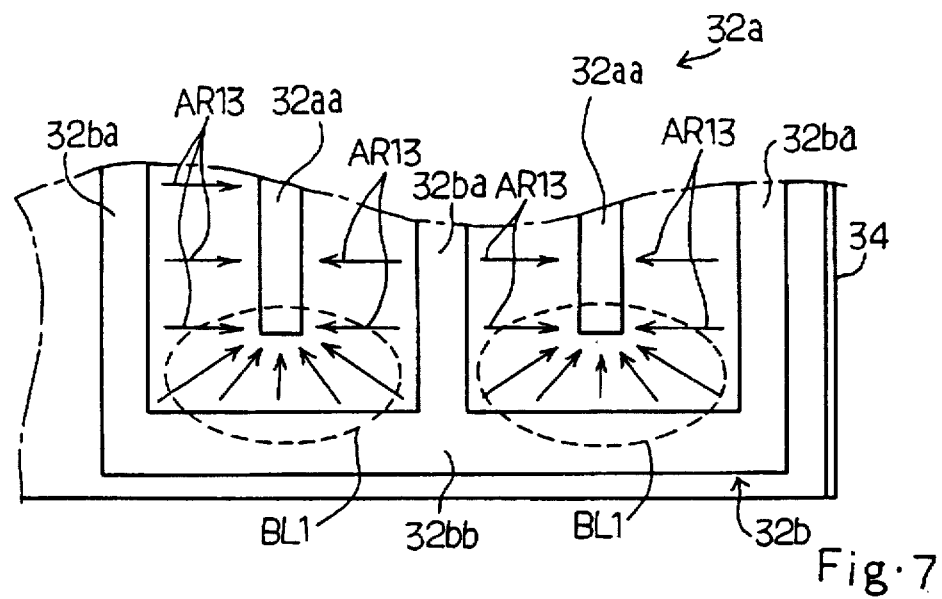
FIG. 7 is a plan view showing the interdigitated comb-like electrodes.

The previously proposed piezoelectric ceramic transformer shown in FIG. 6 is basically polarized in the longitudinal direction AR10 to AR12. However, the electric field between the boss portions 32ab/32bb and the finger portions 32ba/32aa is not directed to the longitudinal direction as shown in FIG. 7. The electric field radially directed elongates and contracts the portions encircled in broken lines BL1 differently from the other portions, and a large strain takes place in the portions encircled in broken lines BL1. This results in undesirable cracks. Even if the cracks do not take place, the portions encircled in broken lines BL1 impede the vibrations in the longitudinal direction, and the previously proposed piezoelectric ceramic transformer can not achieve the step-up ratio to be expected.

On the other hand, the ring-shaped input electrodes 42a/42b generate electric field directed to the longitudinal direction of the ceramic plate 41, and any disturbance does not take place. For this reason, the piezoelectric ceramic transformer according to the present invention is free from cracks due to differently directed strain, and is expected to achieve a step-up ratio larger than that of the previously proposed piezoelectric ceramic transformer.

The present inventors evaluated the piezoelectric ceramic transformer according to the present invention in comparison with the previously proposed piezoelectric ceramic transformer. The electromechanical coupling factor k33 of the previously proposed piezoelectric ceramic transformer was 0.21 in the driving section 31a, and the electromechanical coupling factor k33 of the present invention was 0.27 in the driving sections 41a/41b. The electromechanical coupling factor k33 was 1.3 times increased rather than the electromechanical coupling factor k33 of the driving section 31a. This results in the step-up ratio of 42 1.3 times larger than the step-up ratio of 34. Thus, the piezoelectric ceramic transformer was not only effective against cracks but also increased the step-up ration.

In this instance, the upper and lower surfaces serve as first and second major surfaces, respectively.

As will be understood from the foregoing description, the ring-shaped input electrodes 42a/42b create electric field in the piezoelectric ceramic plate 41 only in the longitudinal direction of the ceramic plate, and achieves a large step-up ratio without cracks.

Figure 14:
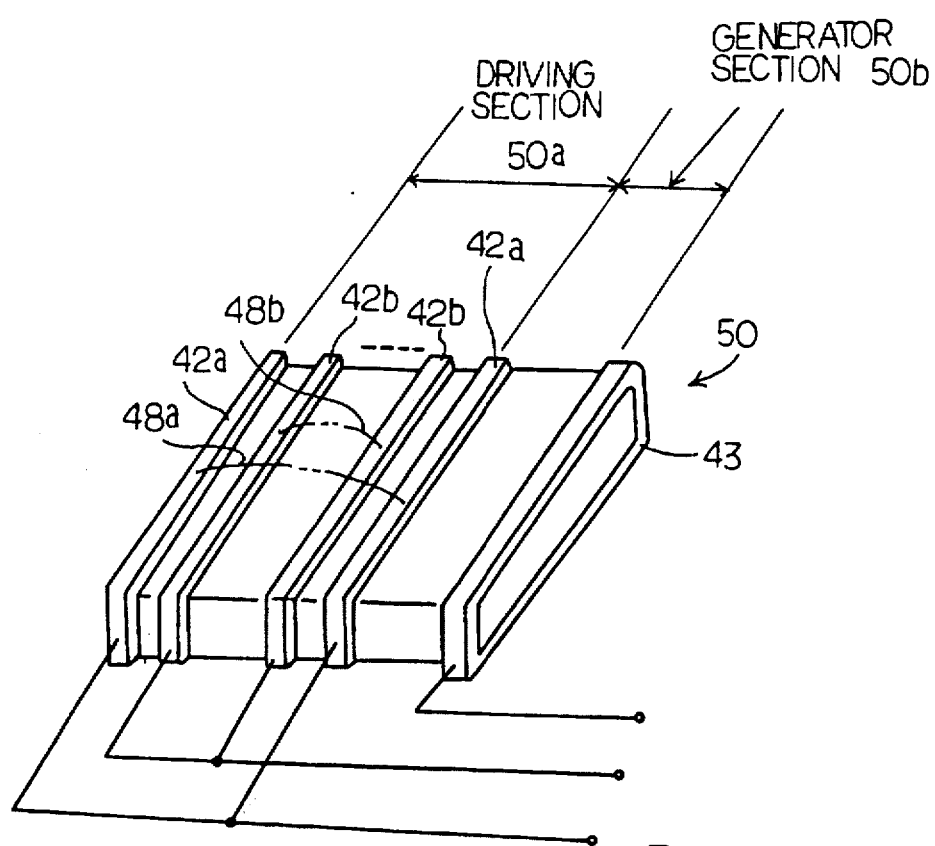
FIG. 14 is a perspective view showing a modification of the piezoelectric ceramic transformer.

A piezoelectric ceramic transformer according to the present invention may have only one driving section 50a and a generator section 50b as shown in FIG. 14. The input electrodes 42a and the input electrodes 42b define a plurality of narrow portions exposed to gaps therebetween, and the plurality of narrow portions are oppositely polarized in the longitudinal direction of the piezoelectric ceramic plate 50. The output electrode 43 is fixed to the generator section 50b, and the generator section 50b is oppositely polarized in the longitudinal direction with respect to the narrow portion between the rightmost input electrode 42a and the associated input electrode 42b adjacent thereto. The voltage was taken out from the output electrode 43.

Second Embodiment

Figure 15:
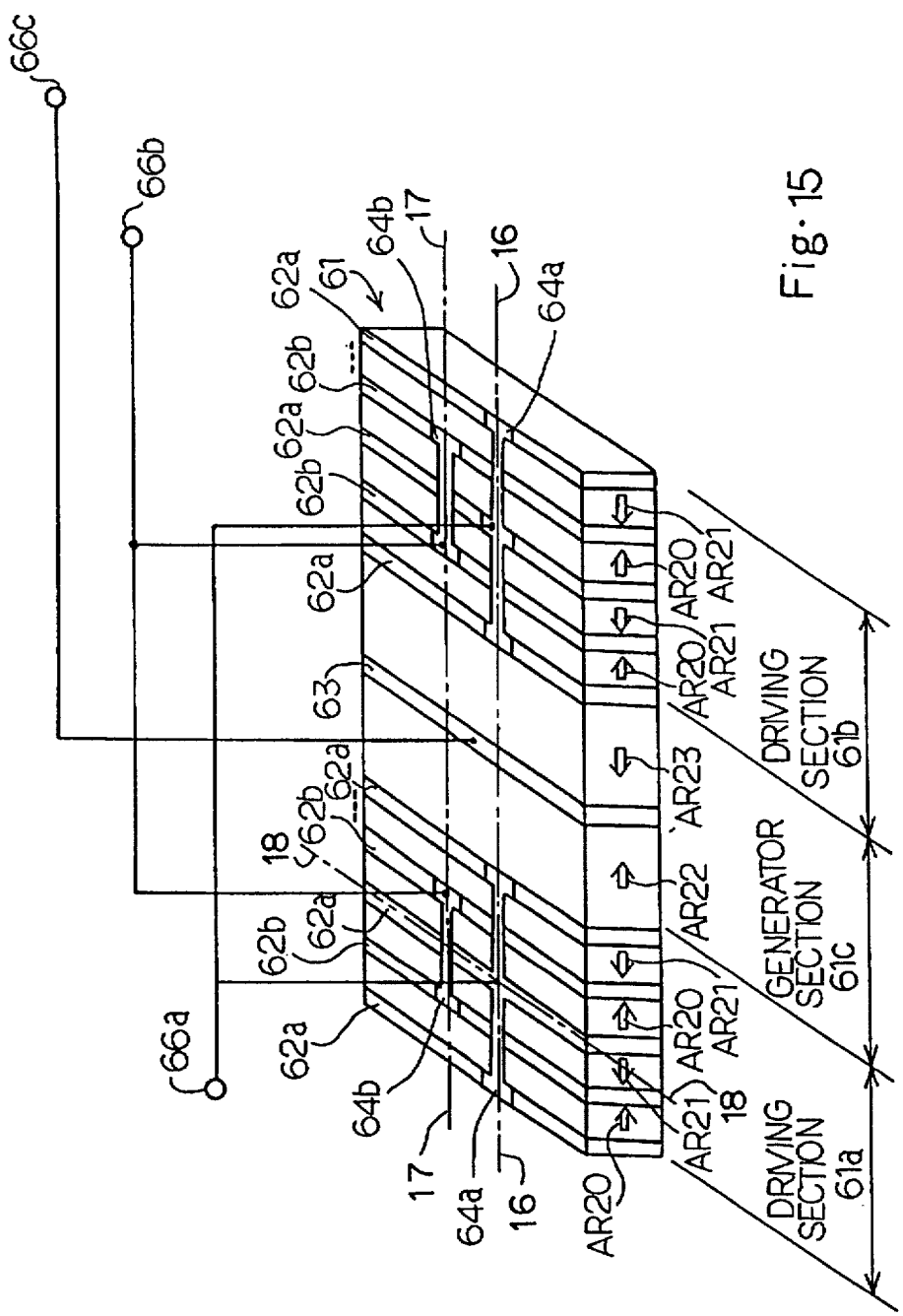
FIG. 15 is a schematic perspective view showing another piezoelectric ceramic transformer according to the present invention.

Turning to FIG. 15 of the drawings, another piezoelectric ceramic transformer embodying the present invention largely comprises a piezoelectric ceramic plate 61, a plurality of ring-shaped input electrodes 62a/62b, a ring-shaped output electrode 63, a plurality of interconnecting strips 64a/64b and a plurality of insulating films 65a/65b (see FIGS. 16 to 18) formed beneath the interconnecting strips 64a/64b.

The piezoelectric ceramic plate 61 has a rectangular parallelopiped configuration, and is divided into driving sections 61a/61b and a generator section 61c. The plurality of ring-shaped input electrodes 62a and 62b are attached to the driving sections 61a at intervals, and divide the driving sections 61b/61b into narrow portions exposed to gaps therebetween. The narrow portions are oppositely polarized in the longitudinal direction of the piezoelectric ceramic plate 61, and the directions of polarization are respectively indicated by arrows AR20 and AR21.

On the other hand, the ring-shaped output electrode 63 is attached to the generator section 61c, and divides the generator section 61c into two halves. The two halves are oppositely polarized in the longitudinal direction as indicated by arrows AR22 and AR23. The output electrode 63 may have conductive strips respectively attached to the upper and lower surfaces of the generator section 61c and a lead wire connected between the conductive strips.

The insulating films 65a and 65b are slightly wider than the conductive strips 64a and 64b, and extend in parallel over the ring-shaped input electrodes 62a/62b and the upper surfaces of the narrow portions exposed between the ring-shaped input electrodes 62a/62b. The insulating films 65a are partially cut away so as to expose the ring-shaped input electrodes 62a, and the insulating films 65b are also partially cut away so as to expose the ring-shaped input electrodes 62b. The conductive strips 64a and 64b are respectively laminated on the insulating films 65a and 65b, respectively, and are held in contact with the ring-shaped input electrodes 62a and the ring-shaped input electrodes 62b, respectively. The conductive strips 64a electrically connect the ring-shaped input electrodes 62a, and are isolated from the ring-shaped input electrodes 62b. On the other hand, the conductive strips 64b electrically connect the ring-shaped input electrodes 62b, and are isolated from the ring-shaped input electrodes 62a.

The dimensions of the input electrodes 62a/62b, the intervals and the number of input electrodes 62a/62b are optimized depending upon the piezoelectric ceramic plate 61 and the followings are one example. When a manufacturer is requested to fabricate a third order Rosen type piezoelectric ceramic transformer on a piezoelectric ceramic plate 61 measuring 42.0 millimeters in length, 10.0 millimeters in width and 1.0 millimeter in thickness, the manufacturer may design the width of the ring-shaped input electrodes 62a/62b, the gap between the adjacent ring-shaped input electrodes 62a/62b and the number of the ring-shaped input electrodes 62a/62b to be 0.3 millimeter, 0.6 millimeter and sixteen, respectively.

EXAMPLE

The present inventors fabricated a piezoelectric ceramic transformer implementing the second embodiment as follows.

First, the present inventors prepared piezoelectric ceramic powder in PbZrO$_3$—PbTiO$_3$ system sold as NEPEC8 as similar to the first embodiment. Paste was formed from the piezoelectric ceramic powder, and was shaped into a rectangular parallelopiped configuration. The paste was sintered, and the sintered product measured 42.0 millimeters in length, 10.0 millimeters in width and 1.0 millimeter in thickness.

Conductive paste such as silver paste or silver-palladium paste was screen printed on the upper, lower and side surfaces of the sintered product or the piezoelectric ceramic plate 61 for the input electrodes 62a/62b and the output electrode 63. The conductive paste was sintered so as to form the input electrodes 62a/46b and the output electrode 63.

Subsequently, the generator section 61c was polarized by using the electric field quenching technique. In detail, the input electrodes 62a and 62b were short-circuited with conductive jigs (not shown), and the output electrode 63 was grasped with another conductive jig (not shown). The piezoelectric ceramic plate 61 was put into high temperature air at 300 degrees to 350 degrees in centigrade, and direct current was applied between the input electrodes 62a/62b and the output electrode 63 in such a manner as to create electric field ranging between 0.5 kv/mm to 0.7 kv/mm. The temperature was lowered to 100 degrees in centigrade or less without removal of the electric field. When the piezoelectric ceramic plate 61 was lowered to or under 100 degrees in centigrade, the direct current was removed. As a result, the generator section 61c was polarized as shown in FIG. 15.

Subsequently, insulating substance such as, for example, polyimide resin was patterned into strips, and the polyimide resin strips were cured so as to form the insulating films 65a/65b.

Subsequently, the driving sections 61a/61b were polarized by using the high-temperature polarizing technique. In detail, conductive probes (not shown) were pressed against the input electrodes 62a and the input electrodes 62b, and the piezoelectric ceramic plate 61 was dipped into high-temperature silicon oil. The silicon oil was heated to 180 degrees in centigrade, and direct current was applied between the input electrodes 62a and 62b in such a manner as to create electric field of 1.8 kv/mm. The driving sections 61a/61b were polarized as shown in FIGS. 15.

Finally, input terminals 66a and 66b were connected to the mid points of the conductive strips 64a and to the mid points of the conductive strips 64b. An output terminal 66c was connected to the mid point of the output electrode 63.

The piezoelectric ceramic transformer behaved as follows. Alternating current was applied between the input terminals 66a and 66b, and the frequency of the alternating current was regulated to the resonant frequency of the piezoelectric ceramic transformer.

Every narrow portion between the adjacent input electrodes 62a and 62b converted the electric energy through the electromechanical coupling factor k33 to strain in the longitudinal direction of the piezoelectric ceramic plate 61 in the piezoelectric longitudinal effect 33 mode. The narrow portions were oppositely polarized, and, for this reason, repeated the elongation and the contraction in phase with one another. As a result, the piezoelectric ceramic plate 61 vibrated in the longitudinal direction. The vibrations were propagated to the generator section 61c, and the generator section 61c converted the strain through the electromechanical coupling factor k33 to voltage in the piezoelectric longitudinal effect 33 mode.

The piezoelectric ceramic transformer implementing the second embodiment converted the electric energy to the strain through the electromechanical coupling factor k33 and the strain to the electric energy also through the electromechanical coupling factor k33 as similar to the first embodiment.

The present inventors measured the input voltage and the output voltage for the piezoelectric ceramic transformer implementing the second embodiment and the first to third prior art piezoelectric ceramic transformers. The present inventors confirmed that the piezoelectric ceramic transformer implementing the second embodiment achieved the step-up ratio 1.6 times larger than those of the first to third prior art piezoelectric ceramic transformers.

In this instance, the upper and lower surfaces serve as first and second major surfaces, respectively.

The ring-shaped input electrodes 62a/62b generated electric field directed to the longitudinal direction of the ceramic plate 61, and any disturbance did not take place. For this reason, the piezoelectric ceramic transformer implementing the second embodiment was free from cracks due to differently directed strain, and achieved the step-up ratio 1.3 times larger than that of the previously proposed piezoelectric ceramic transformer.

The laminations of conductive strip 64a/64b and insulating films 65a/65b may be selectively formed on the upper surface, the lower surface and the side surfaces, respectively.

Although particular embodiments of the present invention have been shown and described, it will be obvious to those skilled in the art that various changes and modifications may be made without departing from the spirit and scope of the present invention.

For example, more than two driving sections and more than one generator section may be alternately arranged along the longitudinal direction of a piezoelectric ceramic plate.

What is claimed is:

1. A piezoelectric ceramic transformer comprising:

an elongated ceramic plate divided into at least one driving section and a generator section in a longitudinal direction of said elongated ceramic plate, said generator section being polarized in said longitudinal direction;

a first driving electrode shaped into a ring configuration so as to be held in contact with an upper major surface, a lower major surface and side surfaces of said at least one driving section and electrically connected to a source of high voltage;

a second driving electrode shaped into a ring configuration so as to be held in contact with said upper major surface, said lower major surface and said side surfaces of said at least one driving section, and electrically connected to a source of low voltage, a portion of said at least one driving section between said first driving electrode and said second driving electrode being polarized in said longitudinal direction; and an output electrode attached to said generator section.

2. A piezoelectric ceramic transformer comprising:

a piezoelectric ceramic plate having a longitudinal direction, a transverse direction perpendicular to said longitudinal direction, a direction of thickness normal to a plane defined by said longitudinal direction and said transverse direction, a first major surface substantially in parallel to said plane, a second major surface substantially in parallel to said first major surface and side surfaces substantially in parallel to a plane defined by said longitudinal direction and said direction of thickness, and divided into at least one driving section and at least one generator section separated in said longitudinal direction;

a plurality of first input electrodes shaped into a ring configuration, held in contact with said first major surface, said second major surface and said side surfaces of said at least one driving section, and spaced from one another in said longitudinal direction;

a plurality of second input electrodes shaped into a ring configuration, held in contact with said first major surface, said second major surface and said side surfaces of said at least one driving section, and alternated with said plurality of first input electrodes so as to form gaps therebetween, said plurality of first input electrodes and said plurality of second input electrodes defining a plurality of portions in said at least one driving section, every two adjacent portions in said at least one driving section being oppositely polarized in said longitudinal direction;

an output electrode held in contact with at least said first major surface and said second major surface in said at least one generator section;

a first input wiring connected to said plurality of first electrodes; and a second input wiring connected to said plurality of second electrodes.

3. The piezoelectric ceramic transformer as set forth in claim 2, in which said piezoelectric ceramic plate further has a driving section provided on the opposite side of said generator section to said at least one driving section, and another set of first input electrodes shaped into a ring configuration and another set of second input electrodes shaped into a ring configuration are alternately attached to said driving section, said first input electrodes of said another set and said second input electrodes of said another set being electrically connected through a third input wiring and a fourth input wiring, respectively, said first input electrodes of said another set and said second input electrodes of said another set defining a plurality of portions in said driving section, every two adjacent portions in said driving section being oppositely polarized in said longitudinal direction.

4. The piezoelectric ceramic transformer as set forth in claim 2, in which said output electrode has a ring configuration, and is further held in contact with said side surfaces of said at least one generator section.

5. The piezoelectric ceramic transformer as set forth in claim 2, in which said first input wiring and said second input wiring are implemented by conductive metallic bonding wires.

6. The piezoelectric ceramic transformer as set forth in claim 5, in which said conductive metallic bonding wires are formed of aluminum.

7. The piezoelectric ceramic transformer as set forth in claim 5, in which said plurality of first input electrodes and said plurality of second input electrodes have a first input electrode positioned at a center of said plurality of first input electrodes and a second input electrode positioned at a center of said plurality of second input electrodes, and said first input electrode and said second input electrode are respectively connected to a first input terminal connected to a first input potential source and a second input terminal connected to a second input potential source.

8. The piezoelectric ceramic transformer as set forth in claim 2, in which said first wiring and said second wiring are implemented by a first conductive strip laminated on a first insulating film and a second conductive strip laminated on a second insulating film, and said first insulating film and said second insulating film have first openings exposing contact areas of said plurality of first electrodes and second openings exposing contact areas of said plurality of second input electrodes so that said first conductive strip and said second conductive strip are held in contact through said first openings to said plurality of first electrodes and through said second openings to said plurality of second input electrodes, respectively.

* * * * *

UNITED STATES PATENT AND TRADEMARK OFFICE
CERTIFICATE OF CORRECTION

PATENT NO.    : 5,757,106
DATED         : May 26, 1998
INVENTOR(S)   : Yuko SATO et al.

It is certified that error(s) appears in the above-identified patent and that said Letters Patent is hereby corrected as shown below:

Col. 6, line 51, change "A-A" to --9-9--.

Col. 6, line 53, change "B-B" to --10-10--.

Col. 7, line 1, change "C-C" to --16-16--.

Col. 7, line 4, change "D-D" to --17-17--.

Col. 7, line 7, change "E-E" to --18-18--.

Signed and Sealed this

Nineteenth Day of January, 1999

Attest:

Attesting Officer

*Acting Commissioner of Patents and Trademarks*